United States Patent
Downing et al.

(10) Patent No.: US 6,213,195 B1
(45) Date of Patent: Apr. 10, 2001

(54) MODULAR COOLANT MANIFOLD FOR USE WITH POWER ELECTRONICS DEVICES HAVING INTEGRATED COOLERS

(75) Inventors: Robert Scott Downing; Scott Palmer Wilkinson; Thomas Albert Sutrina, all of Rockford, IL (US)

(73) Assignee: Hamilton Sundstrand Corporation, Rockford, IL (US)

( * ) Notice: Subject to any disclaimer, the term of this patent is extended or adjusted under 35 U.S.C. 154(b) by 0 days.

(21) Appl. No.: 09/220,237

(22) Filed: Dec. 23, 1998

(51) Int. Cl.[7] ........................................... F28F 7/00
(52) U.S. Cl. ..................... 165/80.4; 361/699; 361/716
(58) Field of Search ..................... 165/80.4; 361/689, 361/699, 716, 721

(56) References Cited

U.S. PATENT DOCUMENTS

| | | | |
|---|---|---|---|
| 3,551,758 | * 12/1970 | Ferree | 165/80.4 X |
| 3,768,548 | * 10/1973 | Dilay et al. | 165/47 |
| 3,917,370 | 11/1975 | Thornton et al. | 339/16 R |
| 4,631,573 | 12/1986 | Sutrina . | |
| 4,765,387 | 8/1988 | Chrysler et al. . | |
| 5,088,005 | 2/1992 | Ciaccio . | |
| 5,111,280 | * 5/1992 | Iversen | 165/80.4 X |
| 5,349,498 | * 9/1994 | Tanzer et al. | 361/689 |
| 5,353,192 | 10/1994 | Nordin . | |

FOREIGN PATENT DOCUMENTS

| | | | |
|---|---|---|---|
| 4019743 | 1/1992 | (DE) | H05K/7/20 |
| 0603860 | 6/1994 | (EP) | H01L/23/473 |
| 0844812 | 5/1998 | (FR) | H05K/7/20 |

* cited by examiner

*Primary Examiner*—Allen Flanigan
(74) *Attorney, Agent, or Firm*—Marshall, O'Toole, Gerstein, Murray & Borun

(57) ABSTRACT

A modular coolant manifold for use with a power electronics device having a heat sink is disclosed. The modular coolant manifold comprises a base unit having an inlet side, an outlet side, and a pair of interconnecting sidewalls. A portion of the base unit defines a recess adapted to receive the heat sink of the electronics device. The base unit includes an internal coolant passage extending between an inlet port defined in the inlet side and an outlet port defined in the outlet side. The coolant passage is in flow communication with the recess. An inlet manifold is adapted for attachment to the base unit inlet side. The inlet manifold includes an inlet port, a transfer port, and a coolant passage interconnecting the inlet port and the transfer port. The inlet manifold transfer port is in flow communication with the base inlet port. An outlet manifold is adapted for attachment to the base unit outlet side. The outlet manifold includes a transfer port, an outlet port, and a coolant passage interconnecting the transfer port and the outlet port. The outlet manifold transfer port is in flow communication with the base unit outlet port. Accordingly, a coolant medium may be communicated through the recess to extract heat from the heat sink.

18 Claims, 8 Drawing Sheets

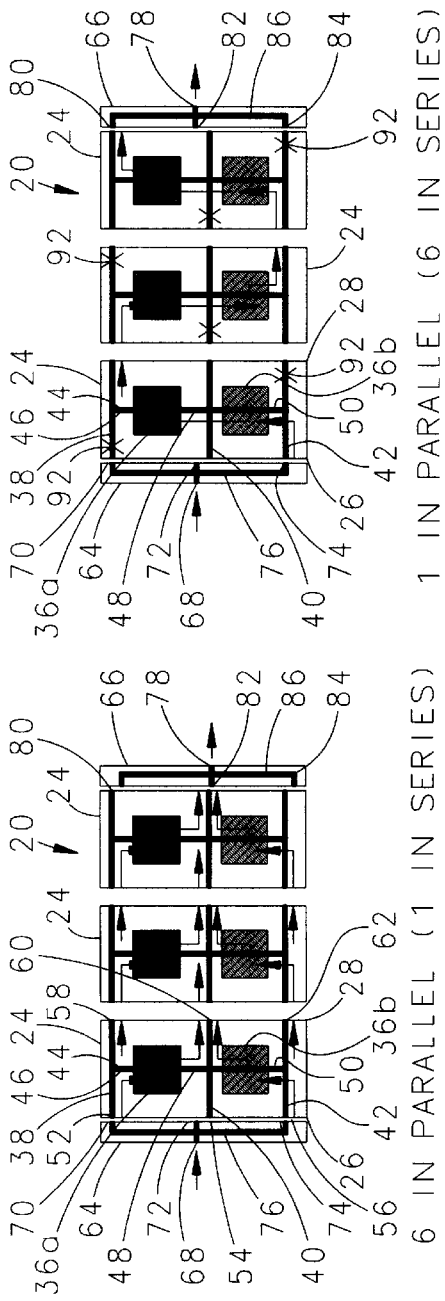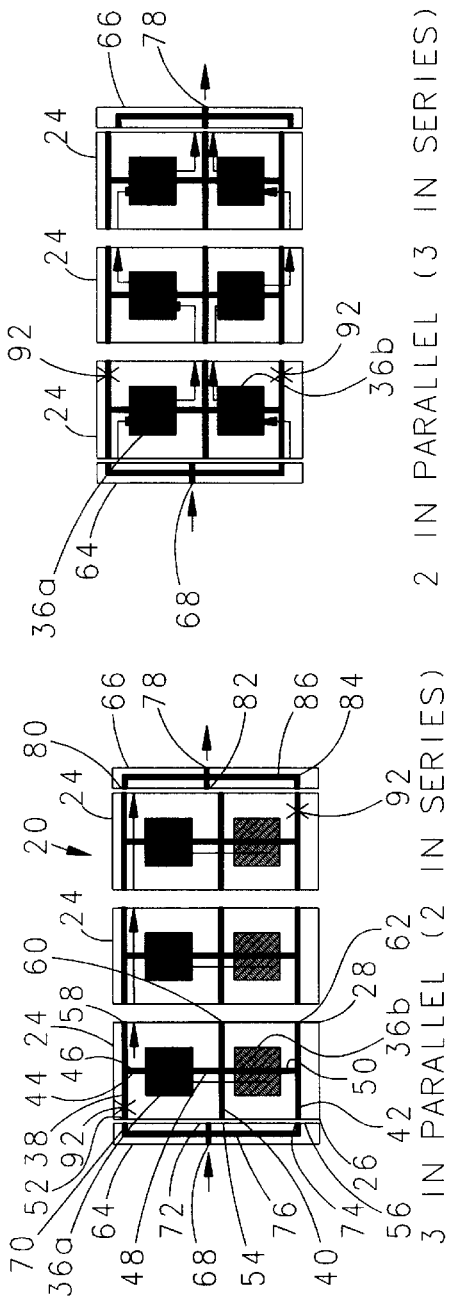

MODULAR COOLANT MANIFOLD FOR USE WITH POWER ELECTRONICS DEVICES HAVING INTEGRATED COOLERS

FIELD OF THE INVENTION

The present invention relates generally to a modular coolant manifold for use with power electronics devices having integrated coolers.

BACKGROUND OF THE INVENTION

Modern electronic components are being manufactured with ever increasing packaging densities which require greatly increased power dissipation capabilities. Proper cooling and power dissipation greatly enhance reliability of the electronic components, and thus thermal management is becoming an extremely important design consideration. Because of the high heat fluxes produced by modern high powered electronic components, future high power electronics for commercial aircraft, aerospace installations, and other applications will likely be liquid cooled.

In such applications where space and weight are important, compact cold plates and modular device coolers are needed. Further, the cooling devices should be low cost and provide high performance cooling of the electronic components, such as solid state power devices used in variable speed, constant frequency power generation systems, DC converters, motor drives, inverters, variable frequency converters and bidirectional converters.

In applications employing high power electronic devices, high performance liquid plate fin heat exchangers or impingement type coolers have been used. Such devices have surface density ranges on the order of 500–1000 and 1500–2500 square meters of surface area per cubic meter of exchanger volume, respectively. Cooling devices with even greater surface density have been developed.

However, because cooling requirements vary substantially from application to application, prior cooling devices have either been individually designed for a specific application, or else an existing cooling device having a known cooling performance equal to or greater than the cooling requirements of the contemplated application must be chosen. In the former case, the need to develop a new design can increase overall costs beyond an acceptable level. In the latter case, inefficiencies are often encountered due to the oversizing of the cooling device. In either case, efficiency could be increased by providing a modular coolant manifold adapted to accept any one of a variety of cooling devices.

SUMMARY OF THE INVENTION

According to one aspect of the invention, a modular coolant manifold is adapted for use with an electronics component having a heat sink structure. The modular coolant manifold comprises a base unit having an inlet side, an outlet side, and a pair of interconnecting sidewalls. A portion of the base unit defines a recess adapted to receive the heat sink of the electronics component. The base unit includes an internal coolant passage extending between an inlet port defined in the inlet side and an outlet port defined in the outlet side. The coolant passage is in flow communication with the recess. An inlet manifold is adapted for attachment to the base unit inlet side. The inlet manifold includes an inlet port, a transfer port, and a coolant passage interconnecting the inlet port and the transfer port. The inlet manifold transfer port is in flow communication with the base inlet port. An outlet manifold is adapted for attachment to the base unit outlet side. The outlet manifold includes a transfer port, an outlet port, and a coolant passage interconnecting the transfer port and the outlet port. The outlet manifold transfer port is in flow communication with the base unit outlet port. Accordingly, a coolant medium may be communicated through the recess to extract heat from the heat sink.

In further accordance with a preferred embodiment, the inlet and outlet manifolds each include a plurality of transfer ports and the base unit includes a plurality of inlet and outlet ports. Each of the base unit inlet and outlet ports is aligned with an adjacent transfer port, thereby defining a plurality of coolant flow paths across the base unit. A plug may be provided which is adapted to block a selected one of the flow paths. A second base similar to the first base may be provided and is adapted for attachment to the first base such that the second base inlet ports are in flow communication with the first base outlet ports and with the second base outlet port being in flow communication with the outlet manifold transfer port. One or more of the bases may include a second recess in flow communication with the coolant passage and also adapted to receive a heat sink. The coolant passage for each base may be adapted to define a plurality of possible coolant flow paths across each base. One or more plugs may be provided to selectively block portions of the flow paths. The recess preferably includes a peripheral edge adapted to receive a seal.

The inlet and outlet manifold transfer ports may be asymmetrically arranged about a centerline of the inlet and outlet manifolds. The asymmetrical arrangement permits either of the manifolds to be mounted to its adjacent base in two possible orientations, and thereby permits portions of the inlet and outlet manifolds to block a selected one of the flow paths. Using the plugs, the flow paths may be adapted to route the coolant medium through the recesses in parallel or in series. Finally, an electronic component having an integral heat sink adapted to be received in the recess may be provided.

In accordance with another aspect of the invention, a modular coolant manifold, which is adapted for use with electronic components having attached coolers, comprises a plurality of base units, each of the base units having an inlet side, an outlet side, and a pair of interconnecting sidewalls. A portion of each base unit defines a recess adapted to receive the cooler from a corresponding one of the components. Each base unit further includes a plurality of inlet and outlet ports and a plurality of interconnecting internal coolant passages, with each recess being in flow communication with at least one of the internal coolant passages. Each base unit is adapted for mounting to an adjacent base unit so that one or more of each base unit coolant passages may be in flow communication with one or more of the coolant passages from the adjacent base unit. An inlet manifold is adapted for attachment to the first base unit, with the inlet manifold having a coolant passage in flow communication with the first base unit coolant passages. An outlet manifold is adapted for attachment to the last one of the base units, with the outlet manifold having a coolant passage in flow communication with the adjacent base unit coolant passages. Thus, a coolant medium may be communicated through each of the base unit recesses thereby extracting heat from the coolers disposed in each of the recesses.

In accordance with yet another aspect of the invention, a manifold for circulating a coolant medium past a power electronics device having a cooler comprises a central base having an inlet side, an outlet side, and a pair of interconnecting sidewalls. The base includes a recess adapted to receive a device cooler and further includes an internal coolant passage extending between an inlet port defined in the inlet side and an outlet port defined in the outlet side. The coolant passage is in flow communication with the recess. An inlet manifold is adapted for attachment to the base inlet side and includes an inlet port, a transfer port, and a coolant passage interconnecting the inlet port and the transfer port. The inlet manifold transfer port is in flow communication with the base inlet port. An outlet manifold is adapted for attachment to the base outlet side and includes a transfer port, an outlet port, and a coolant passage interconnecting the transfer port and the outlet port, with the outlet manifold transfer port being in flow communication with the base outlet port. A coolant medium may therefore be communicated through the recess thereby extracting heat from the cooler disposed in the recess.

In accordance with yet another aspect of the invention, a modular coolant manifold for use with an electronics component having a heat sink comprises a base having an inlet side, an outlet side, and a pair of interconnecting sidewalls. A portion of the base defines a recess adapted to receive the heat sink. The base includes at least one inlet port defined in the inlet side and at least one outlet port defined in the outlet side. The base further includes an internal coolant passage extending between the at least one base inlet port and the at least one base outlet port, with the coolant passage being in flow communication with the recess. A pair of end manifolds are adapted for attachment to the base. One of the end manifolds is disposed adjacent to the base inlet side and includes an inlet port, a transfer port in flow communication with the base inlet port, and an interconnecting coolant passage. The manifold is disposed adjacent the base outlet side and includes a transfer port in flow communication with the base outlet port, and outlet port, and an interconnecting passage. A coolant medium may be communicated through the passages and through the recess to extract heat from the heat sink.

These and other advantages and features of the invention will become readily apparent to those skilled in the art upon a reading of the following description.

BRIEF DESCRIPTION OF THE DRAWINGS

FIG. 8 is a schematic view of a plurality of modular coolant manifold constructed according to the teachings of the present invention connected such that a coolant medium may be routed through the six recesses in parallel;

FIG. 9 is a schematic view showing three base units arranged in parallel, with the two recesses in each unit arranged in series;

FIG. 10 is a schematic view showing all six recesses being arranged in series;

FIG. 11 is a schematic view showing the recesses being arranged to create two parallel flow paths, each having three recesses in series;

DETAILED DESCRIPTION OF THE INVENTION

The embodiments described herein are not intended to limit the scope of the invention to the precise forms disclosed. The embodiments have been chosen and described in order to explain the principles of the invention and its practical use in order to enable others skilled in the art to follow its teachings.

Figure 1:
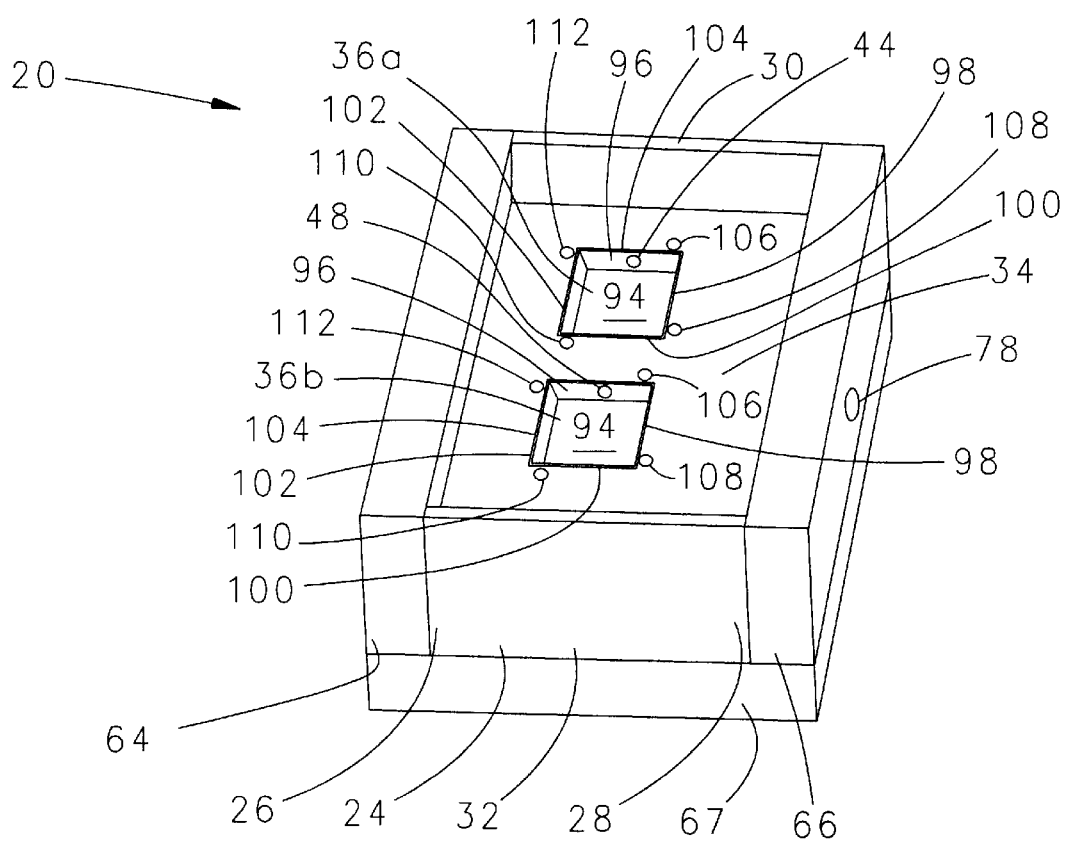
FIG. 1 is a perspective view of a modular coolant manifold constructed in accordance with the teachings of the present invention.
Figure 2:
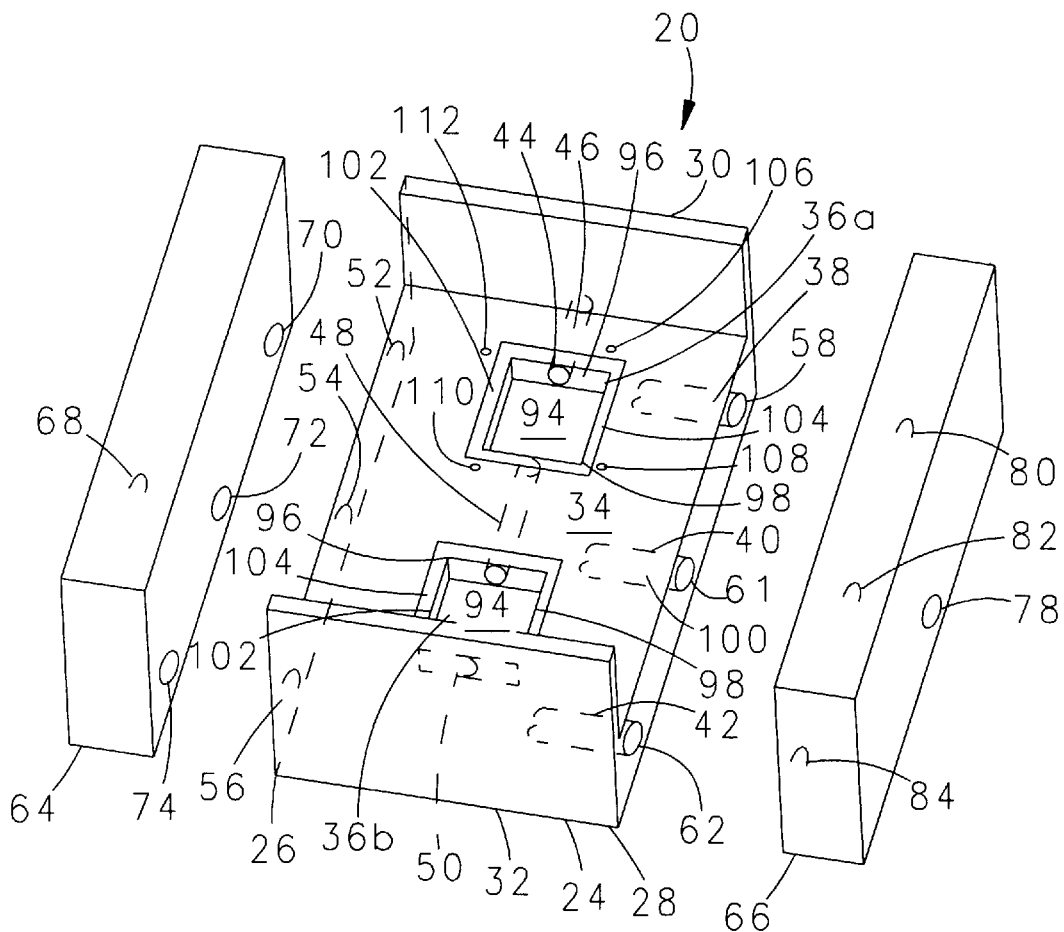
FIG. 2 is an exploded view in perspective of the modular coolant manifold shown in FIG. 1.
Figure 5:
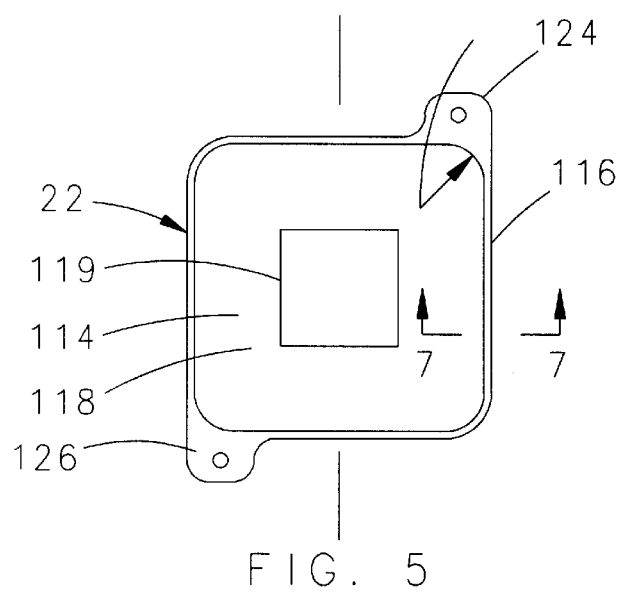
FIG. 5 is a top plan view of a carrier for a power electronics device adapted for use with the present modular coolant manifold and having an integrated heat sink or cooler.
Figure 7:
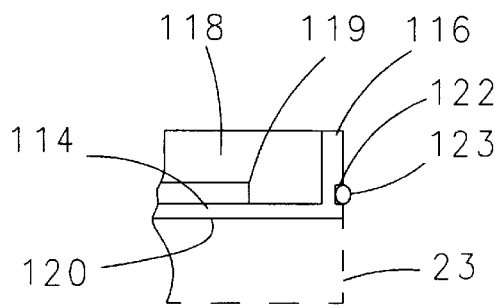
FIG. 7 is an enlarged fragmentary cross-sectional view of the power electronics device taken along lines 7—7 of FIG. 6 and illustrating the seal cross-section.
Figure 6:
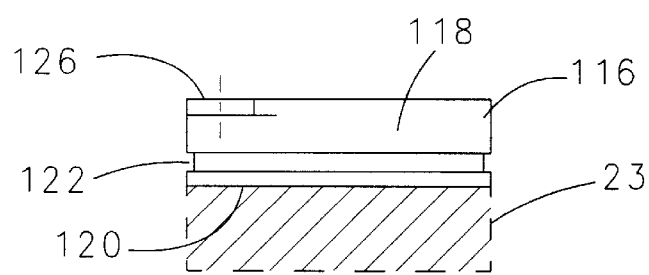
FIG. 6 is a side elevational view of the carrier for a power electronics device shown in FIG. 5; the integrated device cooler is shown in phantom.

Referring now to FIGS. 1 through 4 of the drawings, a modular coolant manifold constructed in accordance with the teachings of the present invention is generally referred to by the reference numeral 20. The modular coolant manifold 20 is adapted for use with a modular power electronics device 22, which is shown in FIGS. 5 through 7 and which includes an integrated device cooler 23. A more complete description of one possible power electronics device 22 having an integrated cooler 23 may be found in co-pending U.S. patent application Ser. No. 09/220,114, Attorney Docket No. 27578/5174, entitled "Modular Power Electronics Die Having Integrated Cooling Apparatus", the entire disclosure of which is incorporated herein by reference, and which is owned by the assignee of the present application As shown in FIGS. 1 and 2, the manifold 20 includes a central base unit 24 having an inlet side 26, an outlet side 28, and a pair of interconnecting side edges 30, 32. The base unit 24 includes a generally planar central portion 34 which includes a pair of identical recesses 36a and 36b. Although two recesses 36a and 36b are shown, it will be understood that the base unit 24 may include additional or fewer such recesses depending on the size of the power electronics device 22, the available space, and other design considerations. Each recess 36a and 36b is adapted to so that a device cooler 23 of a power electronics device 22 may be positioned in each recess 36a and 36b, such that a coolant medium (not shown) may be communicated through both of the recesses. The base unit 24 is preferably constructed of molded plastic material, although the base unit may also be machined or otherwise fabricated from plastic or a suitable metallic or composite material. Such suitable plastic materials may include plastics sold under the trade names Lexan® or Ryton®, as well as phenolic or pomalux-acetal plastic.

As shown schematically in each of FIGS. 8 through 11, each base unit 24 includes three passages 38, 40, 42 extending across each base unit 24, and also includes a transverse passage 44 which extends between and interconnects the passages 38, 40 and 42. Each of the passages 38, 40, 42 and 44 is preferably in the range of 0.020 inches to 0.025 inches in diameter. As shown in FIGS. 4 and 8 through 11, the transverse passage 44 extends through or intersects the recesses 36, and thus the passage 44 includes three distinct segments 46, 48, and 50. The segment 46 connects the passage 38 with the recess 36a, the segment 48 connects the recesses 36a and 36b and intersects passage 40, and the segment 50 connects the recess 36b with the passage 42. It will be understood that the passage 44 may include additional or fewer discrete segments depending on the number of recesses included in the base unit 24.

The base unit 24 also includes a plurality of inlet ports 52, 54 and 56 disposed on the inlet side 26, and further includes a plurality of outlet ports 58, 60 and 62 disposed on the outlet side 28. As shown in the schematic views of FIGS. 8 through 11, the passage 38 interconnects ports 52 and 58, the passage 40 interconnects ports 54 and 60, while the passage 42 interconnects ports 56 and 62. Also, it will be appreciated from FIGS. 8 through 11 that a number of identical base units 24 may be arranged together as shown to form an expanded or enlarged coolant manifold. As would be known by one of skill in the art, the adjacent base units 24 may be attached by any suitable glue or adhesive material, or by suitable mechanical fasteners.

Figure 3:
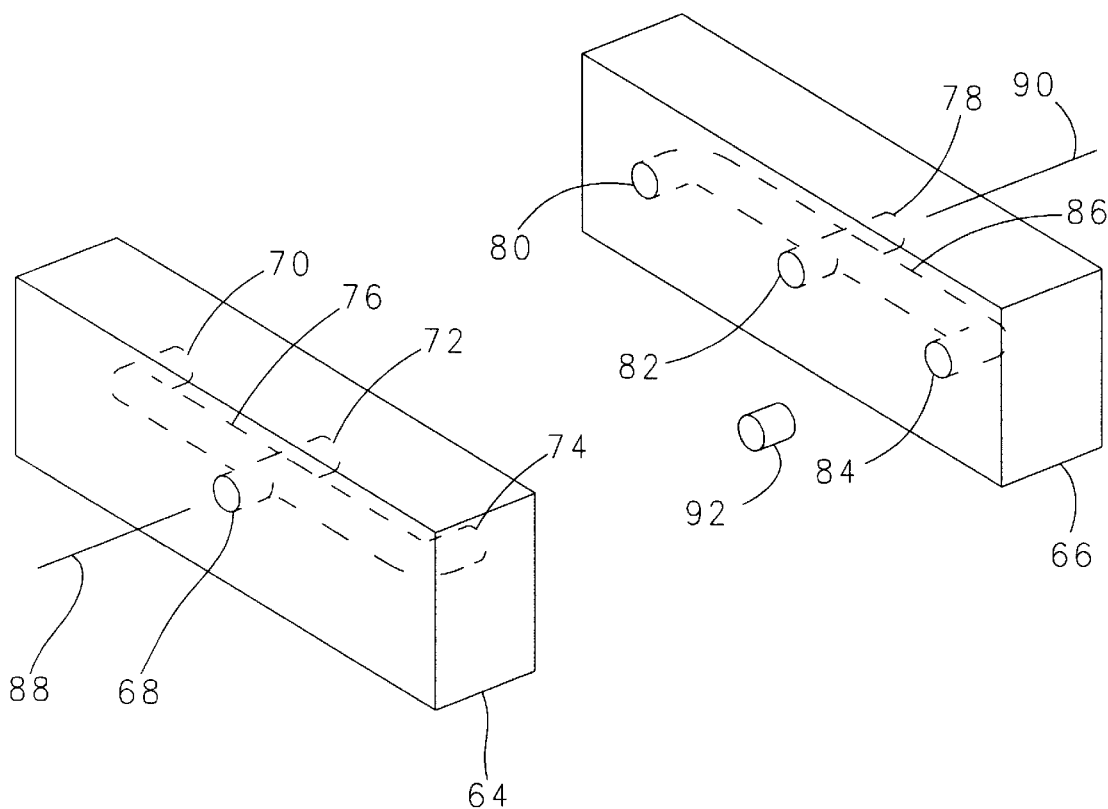
FIG. 3 is a perspective view both of the end manifolds with their respective internal coolant passages being shown in phantom.

As shown in FIGS. 1 through 3, an inlet manifold 64 is attached to the inlet side 26 of the base unit 24, while an outlet manifold 66 is attached to the outlet side 28 of the base unit 24. The inlet and outlet manifolds 64, 66 may be attached to the base unit using known methods, such as by bonding the items together using commercially available adhesives such as Caseway Acrylic SC-125 or methyl ethyl ketone (MEK) adhesive. Other commercially available industrial adhesives may also be employed. Preferably, the inlet and outlet manifolds 64 and 66 are identical, i.e., they are the same part number. A shown in FIG. 1, the base unit 24 as well as the manifolds 64 and 66 are preferably mounted such as by glues or adhesives to a common backing plate 67 in order to provide strength and rigidity to the assembled modular coolant manifold 20.

The inlet and outlet manifolds 64 and 66, along with the raised side edges 30 and 32 may define a cavity which may be filled with a suitable potting material as would be known to one of skill in the art. The potting material protects the electronic device(s) from humidity, absorbs shock and vibration, protects the device(s) from chemical contamination, and provides electrical isolation. Examples of suitable potting materials would include silicone based compounds such as Sylguard® manufactured by Dow Chemical. As shown in FIG. 3, the inlet manifold 64 includes an inlet port 68 and three transfer ports 70, 72, 74. An internal passage 76 interconnects the port 68 with the transfer ports 70, 72 and 74. Similarly, the outlet manifold 66 includes an outlet port 78 and three transfer ports 80, 82 and 84. An internal passage 86 interconnects the port 78 with the transfer ports 80, 82 and 84. The passages 76 and 86 are preferably sized to match the diameter of the passages 3 8, 40 and 42 described above. Preferably, the transfer ports 70, 72 and 74 of the inlet manifold 64 are arranged symmetrically about a centerline 88 of the inlet manifold 64. Similarly, the transfer ports 80, 82 and 84 of the outlet manifold 66 may be arranged symmetrically about a centerline 90 of the outlet manifold 66. Consequently, the inlet manifold 64 and the outlet manifold 66 may be rotated about their respective centerlines 88, 90 and mounted in one of two possible orientations. For example, the inlet manifold 66 may be mounted to the base unit 24 so that the transfer port 70 is aligned with the adjacent inlet port 52 and so that the transfer port 74 is aligned with the adjacent inlet port 56 as shown in FIG. 2. Alternatively, the inlet manifold 64 may be rotated about its centerline 88 so that the transfer port 70 would be aligned with the inlet port 56 and so that the transfer port 74 would be aligned with the inlet port 52. The outlet manifold 66 may be rotated in a similar manner.

As shown in FIG. 3 and schematically in FIGS. 9, 10 and 11, one or more plugs 92 may be placed in any of the above described passages in order to selectively block one or more of the above-described passages. Preferably, the plugs are manufactured from the same plastic material as the base unit 24, are generally cylindrical, and are sized to be slightly larger than the diameter of the above described passages so as to be held in place in the selected passage by an interference fit, or the plugs 92 may be glued or bonded in place. Alternatively, or in addition to the use of one or more plugs 92, selected passages 38, 40 or 42 may be blocked due to the asymmetric arrangement of the inlet ports and the outlet ports on the base unit 24 in a manner that will be explained in greater detail below.

Figure 4:
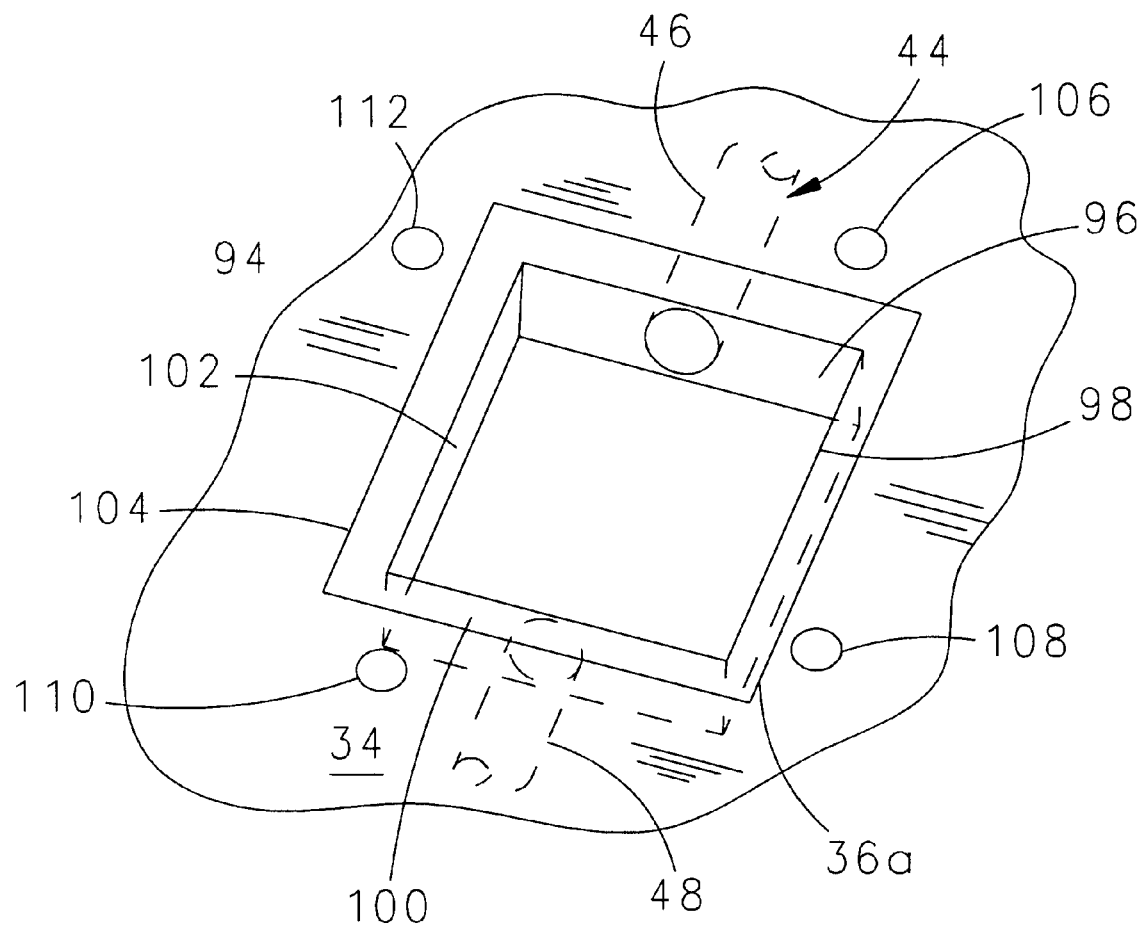
FIG. 4 is an enlarged fragmentary view in perspective of the base unit recess which is adapted to receive a power electronics device having an integrated device cooler.

Referring now to FIGS. 1, 2 and 4, recess 36a and 36b includes a bottom surface 94 and four sidewalls 96, 98, 100 and 102. As shown in FIG. 1, the segment 46 extends through the sidewall 96 of recess 36a, the segment 48 extends through sidewall 100 of recess 36a and sidewall 96 of recess 36b. The segment 50 extends through the sidewall 100 of recess 36b. The sidewalls 96, 98, 100 and 102 of each recess 36a, 36b are surrounded by a perimeter 104. The perimeter 104 is preferably constructed of any well known packing material, such as an elastomeric material. Four threaded mounting apertures 106, 108, 110 and 112 surround each recess 36a and 36b. Alternatively, the perimeter 104 may be stepped so as to form a seat (not shown).

Referring now to FIGS. 5, 6 and 7, the power electronics device 22 includes a base 114 and a surrounding peripheral sidewall 116 defining a cavity 118. An electronic component such as an integrated circuit 119 is mounted to the base 114 within the cavity 118. The integrated device cooler 23 is mounted to a bottom face 120 of the base 114. The device cooler 23 is sized to be received within the recesses 36a or 36b, and may be any one of various types of device coolers, such as a pin-fin, plate fin, a CHMC cooler, a zig-zag cooler, or other known types of coolers having an enhanced surface area. Preferably, at least one of such known types of coolers will be adapted to have two possible flow paths through or across the cooler 23, with one of the flow paths being characterized by a high pressure drop, high heat transfer condition, and the other flow path being characterized by a low pressure drop, low heat transfer condition. A portion of the base 114 includes a peripheral groove 122 adapted to receive an O-ring seal 123. A pair of mounting ears or tabs 124, 126 are disposed on opposite corners of the power electronics device 22. By virtue of the placement of the tabs 124, 126, the power electronics device 22 may be mounted to the base 24 of the manifold 20 in one of two orientations as explained below.

In operation, one or more base units 24 are assembled by attachment to the inlet and outlet manifold 64, 66 using known techniques. As outlined above, the end manifolds 64, 66 may be positioned as shown in FIGS. 2 or 9, such that the transfer ports 70, 74 are aligned with the inlet ports 52, 56, respectively of the base unit 24, and such that the transfer ports 80, 84 are aligned with the outlet ports 58, 62, respectively. As shown in the schematic of FIG. 9. When the manifolds 64, 66 are so positioned, the passage 40 is blocked. Either one of the manifolds 64 or 66 may be mounted in a different orientation. For example, the schematic of FIG. 8 shows the outlet manifold 66 oriented one way, while the schematic of FIG. 9 shows the outlet manifold oriented another way. It will be appreciated that one or both of the manifolds 64, 66 may be oriented as desired in order to achieve the desired flow paths for the coolant medium. Also, one or more plugs 92 may be positioned as desired in order to block selected passages as shown in the schematics of FIGS. 8 through 11, again to achieve desired flow paths.

With the manifold 20 assembled as desired, the power electronics device 22 having the electronic component 119 mounted thereon is mounted to each recess 36a, 36b of each base unit 24. As alluded to above, each such power electronics device 22 may be mounted to the base unit 24 in one of two possible orientations. For example, the power electronics device 22 may be mounted to the base unit by attaching the tabs 124, 126 to the apertures 106, 110, respectively. Alternatively, the power electronics device 22 may be oriented in a second position roughly 90 degrees relative to the first position, by attaching the tabs 124, 126 to the apertures 108, 112, respectively. Conventional mounting screws or bolts may be used. Preferably, helical inserts are used in the base unit 24.

The device cooler 23 of each power electronics device 22 is sized to be disposed within the corresponding recess 36a or 36b. By virtue of the seal 123 surrounding the base 114 of the power electronics device 22, any of the coolant medium which is communicated through the recesses 36a or 36b is prevented form leaking out of the manifold 20. The cooler 23 of the power electronics device 22 is preferably sized to fit tightly between the sidewalls 98 and 102, which thereby ensures that the coolant medium will circulate through the cooler 23 rather than simply flow past the cooler 23. A bottom portion of the cooler 23 will similarly fit tightly against the bottom surface 94 of the corresponding recess in order to prevent coolant from flowing under the cooler 23.

Referring now to the schematics of FIGS. 8 through 11, a number of possible arrangement can be achieved, each defining one or more possible flow paths across the manifold 20. For example, when arranged as shown in FIG. 8, the coolant medium flows through each of the recesses in parallel. When arranged as shown in FIG. 9, the coolant is routed along three parallel flow paths, each flow path having two coolers 23 arranged in series. When arranged as shown in FIG. 10, the coolant flows along a flow path having six coolers 23 arranged in series, while the diagram of FIG. 11 shows two parallel flow paths, each having three coolers 23 arranged in series. Other additional arrangements may be contemplated.

Figure 12:
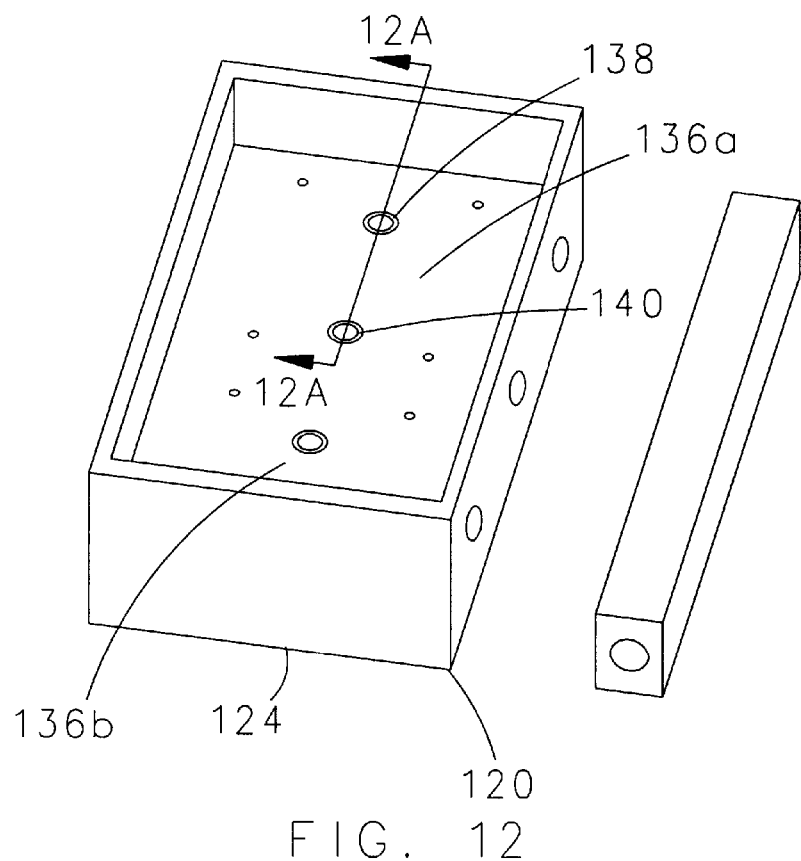
FIG. 12 is a fragmentary exploded view in perspective of a modular coolant manifold constructed in accordance with the teachings of a second embodiment of the present invention.
Figure 12A:
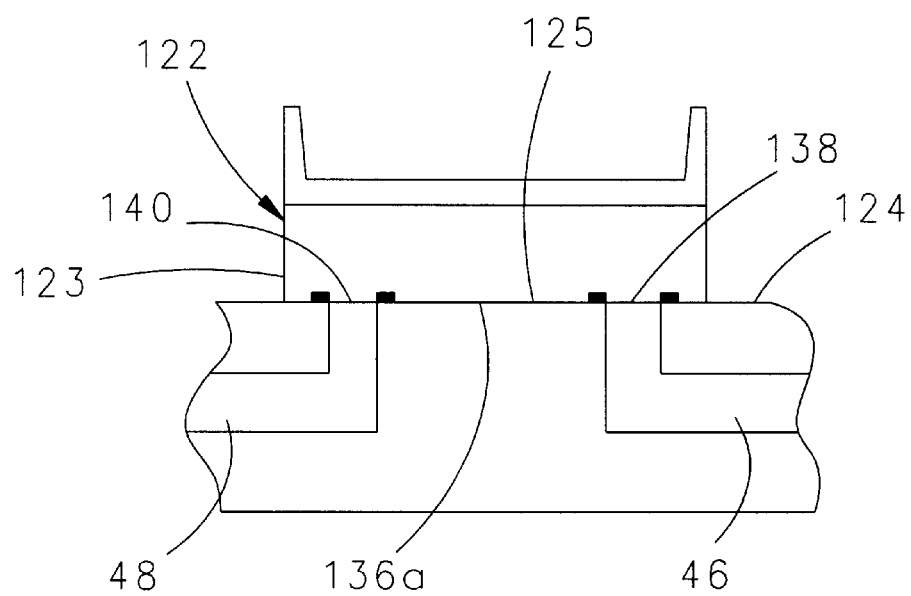
FIG. 12A is a cross-sectional view taken along line 12a—12a of FIG. 12 and illustrating schematically the coolant flow path through one of the mounting areas.

FIG. 12 illustrates an alternative construction for the base unit is referred to by the reference numeral 124. In the alternative construction, the base unit 124 the recesses 36a and 36b are replaced by a pair of mounting areas 136a and 136b. All other elements of the base unit 24 and the manifolds 64 and 66 are substantially similar and thus will not be described again. The mounting area 136a includes a first coolant port 138 in communication with the segment 46, and a second coolant port 140 in communication with the segment 48. FIG. 12A illustrates schematically the coolant flow path from the first coolant port 138 to the second coolant port 140 through a cooler 123 of a power electronics device 122 mounted on the mounting area 136a. It will be understood that the cooler 123 is adapted to have coolant entry and exit from a bottom face 125 thereof. It will also be understood that a power electronics device 122 may be mounted to the mounting area 136b in a similar manner for similar coolant flow.

Figure 13:
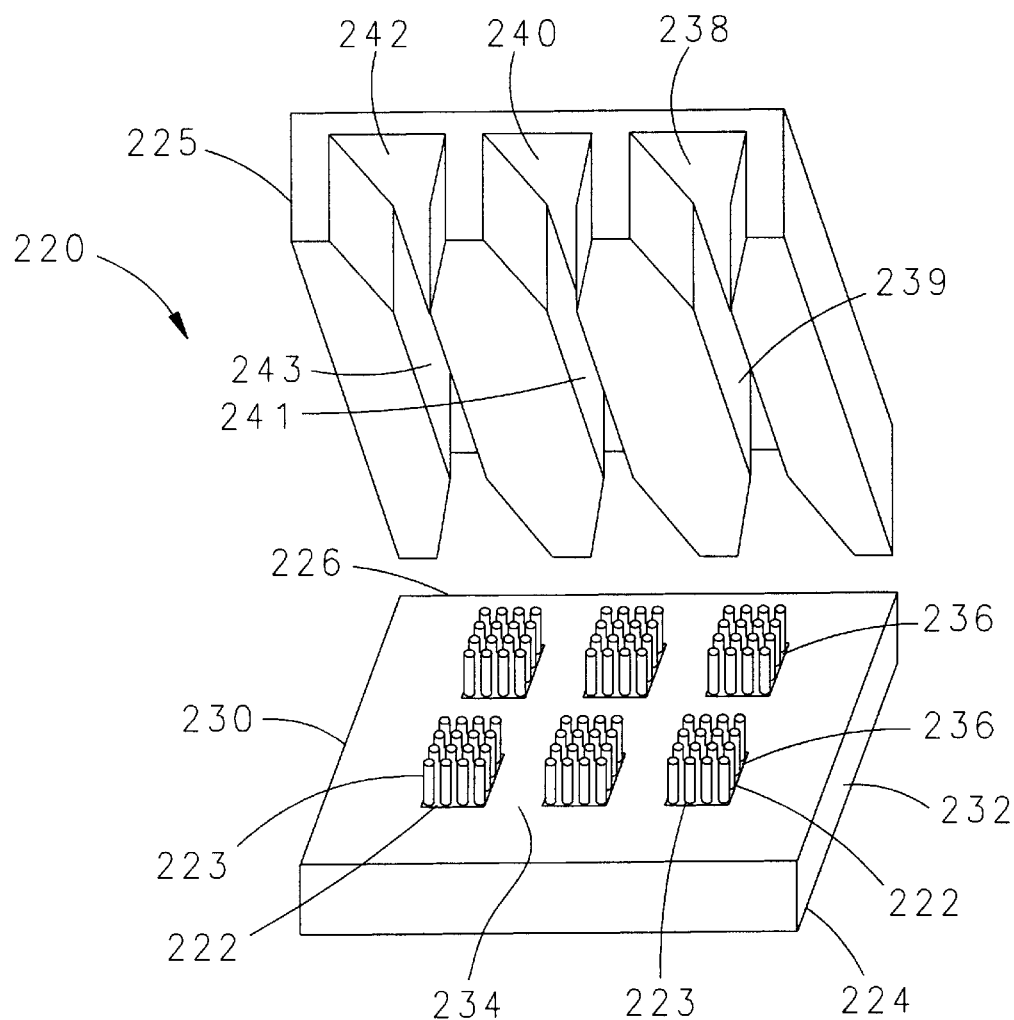
FIG. 13 is a partially exploded view in perspective of a modular coolant manifold constructed in accordance with the teachings of a third embodiment of the present invention.

Referring now to FIG. 13, a modular coolant manifold constructed in accordance with the teachings of a third embodiment of the invention is generally referred to by the reference numeral 220. The manifold 220 is adapted to receive therein a plurality of electronic components 222, each having an attached device cooler 223. The manifold 220 includes a base unit 224 having an inlet side 226, an outlet side 228, and a pair of interconnecting side edges 230, 232. The base unit 224 includes a generally planar central portion 234 which includes a pair of identical recesses 236. Although six recesses 236 are shown, it will be understood that the base unit 224 may include additional or fewer such recesses depending on the size of the power electronics device 222, the available space, and other design considerations. Each recess 236 is adapted to so that a device cooler 223 of a power electronics device 222 may be positioned in each recess 236 such that a coolant medium (not shown)

may be communicated past the device cooler 223 protruding from each of the recesses 236. In the embodiment shown, the manifold 220 is adapted so that the coolant medium may be air or a gas.

Figure 14:
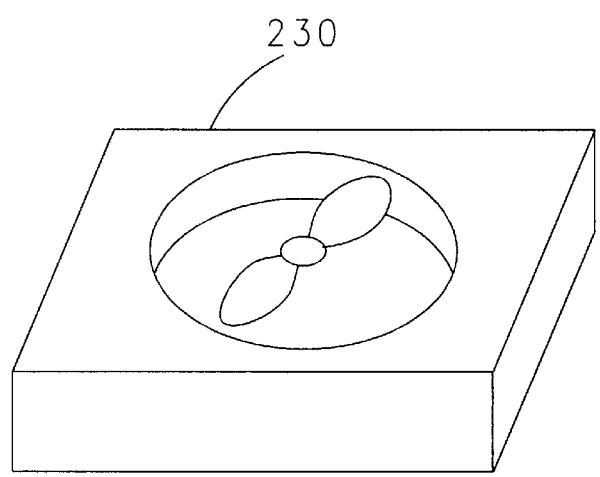
FIG. 14 is a fan unit for supplying pressurized air to the embodiment shown in FIG. 13.

The header or top unit 225 is removably mounted to the base unit 224 and includes three passages 238, 240, 242 extending across the top unit 225. Each passage 238, 240, and 242 includes a narrowed venturi or constriction 239, 241, and 243, respectively. The constrictions 239, 241 and 243 are adapted to fit tightly around the device coolers 223 so as to direct the coolant medium through the device coolers 223 rather than around the device coolers. The manifold 220 may be used with any suitable feed system or header as would be well known in the art, and may be suited for use with an air supply system such as the fan unit 230 shown in FIG. 14.

Numerous modifications and alternative embodiments of the invention will be apparent to those skilled in the art in view of the foregoing description. Accordingly, this description is to be construed as illustrative only and is for the purpose of teaching those skilled in the art the best mode of carrying out the invention. The details of the structure may be varied substantially without departing from the spirit of the invention, and the exclusive use of all modifications which come within the scope of the appended claims is reserved.

What is claimed:

1. For use with a power electronic device having a heat sink, a modular coolant manifold, comprising:
    a base having an inlet side, an outlet side, and a pair of interconnecting sidewalls, a portion of the base defining a recess adapted to receive the heat sink, the base including an internal coolant passage extending between a plurality of inlet ports defined in the inlet side and a plurality of outlet ports defined in the outlet side, the coolant passage being in flow communication with the recess;
    an inlet manifold adapted for attachment to the base inlet side, the inlet manifold having an inlet port, a plurality of transfer ports, and a coolant passage interconnecting the inlet port and the transfer ports, at least one of the inlet manifold transfer ports being in flow communication with at least one of the base inlet ports; and
    an outlet manifold adapted for attachment to the base outlet side, the outlet manifold having a plurality of transfer ports, an outlet port, and a coolant passage interconnecting the transfer ports and the outlet port, at least one of the outlet manifold transfer ports being in flow communication with at least one of the base outlet ports;
    whereby a coolant medium may be communicated through the recess to extract heat from the heat sink.

2. The device of claim 1, wherein at least two inlet manifold transfer ports are aligned with an adjacent base inlet port, and further wherein at least two outlet manifold transfer ports are aligned with an adjacent base outlet port, thereby defining a plurality of flow paths across the base.

3. The device of claim 1, including a plug adapted to block a selected one of the flow paths.

4. The device of claim 1, wherein the inlet and outlet manifold transfer ports are asymmetrically arranged about a centerline of the inlet and outlet manifolds, thereby permitting portions of the inlet and outlet manifolds to block a selected one of the flow paths.

5. For use with a power electronic device having a heat sink, a modular coolant manifold, comprising:
    a base having an inlet side, an outlet side, and a pair of interconnecting sidewalls, a portion of the base defining a recess adapted to receive the heat sink, the base including an internal coolant passage extending between an inlet port defined in the inlet side and an outlet port defined in the outlet side, the coolant passage being in flow communication with the recess;
    an inlet manifold adapted for attachment to the base inlet side, the inlet manifold having an inlet port, a transfer port, and a coolant passage interconnecting the inlet port and the transfer port, the inlet manifold transfer port being in flow communication with the base inlet port; and
    an outlet manifold adapted for attachment to the base outlet side, the outlet manifold having a transfer port, an outlet port, and a coolant passage interconnecting the transfer port and the outlet port, the outlet manifold transfer port being in flow communication with the base outlet port; and
    a second base having an inlet side, an outlet side, and a pair of interconnecting sidewalls, a portion of the second base defining a recess adapted to receive a heat sink, the second base including an internal coolant passage extending between an inlet port defined in the inlet side and an outlet port defined in the outlet side, the coolant passage being in flow communication with the recess, the second base being adapted for placement adjacent to the first mentioned base with the second base inlet port being in flow communication with the first base outlet port and with the second base outlet port being in flow communication with the outlet manifold transfer port, whereby a coolant medium may be communicated through the recesses to extract heat from the heat sinks.

6. For use with a plurality of power electronic devices, each of the power electronic devices having a heat sink, a modular coolant manifold, comprising:
    a first base, the first base having an inlet side, an outlet side, and a pair of interconnecting sidewalls, a portion of the first base defining a pair of recesses, each of the recesses being adapted to receive a heat sink the first base including an internal coolant passage extending between a plurality of inlet ports defined in the inlet side and a plurality of outlet ports defined in the outlet side, the coolant passage being in flow communication with the recesses;
    a second base substantially identical to the first base, the second base input ports being aligned with the first base output ports;
    an inlet manifold adapted for attachment to the inlet side of the first base, the inlet manifold having an inlet port, a plurality of transfer ports, and a coolant passage interconnecting the inlet port and the transfer ports, the inlet manifold transfer ports being in flow communication with the first base inlet port; and
    an outlet manifold adapted for attachment to the second base outlet side, the outlet manifold having a plurality of transfer ports, an outlet port, and a coolant passage interconnecting the transfer ports and the outlet port, the outlet manifold transfer ports being in flow communication with the second base outlet ports;
    whereby a plurality of flow paths is defined between the inlet and outlet manifolds, and whereby a coolant medium may be communicated through the recesses to extract heat from the heat sinks.

7. The device of claim 6, including a plurality of plugs adapted to block selected portions of the flow paths, whereby the coolant medium flows through the recesses in parallel.

8. The device of claim 6, including a plurality of plugs adapted to block selected portions of the flow paths, whereby the coolant medium flows through the recesses in series.

9. A modular coolant manifold for use with electronic components having attached coolers, the manifold comprising:

- a plurality of base units, each of the base units having an inlet side, an outlet side, and a pair of interconnecting sidewalls, a portion of each base unit defining a recess adapted to receive the cooler from a corresponding one of the components, each base unit further including a plurality of inlet and outlet ports and a plurality of interconnecting internal coolant passages, each recess being in flow communication with at least one of the internal coolant passages, each base unit being adapted for mounting to an adjacent base unit so that each base unit coolant passage is in flow communication with its adjacent base unit coolant passages;
- an inlet manifold adapted for attachment to a first one of the base units, the inlet manifold having a coolant passage in flow communication with the first base unit coolant passages; and
- an outlet manifold adapted for attachment to a last one of the base units, the outlet manifold having a coolant passage in flow communication with the last base unit coolant passages;
- whereby a coolant medium may be communicated through each of the base unit recesses thereby extracting heat from the coolers disposed in each of the recesses.

10. The device of claim 9, wherein the inlet and outlet manifolds each include a plurality of transfer ports, and wherein each of the base units includes a plurality of inlet and outlet ports, the first base unit inlet ports being aligned with the inlet manifold transfer ports, the last base unit outlet ports being aligned with the outlet manifold transfer ports, thereby defining a plurality of flow paths through the manifold.

11. The device of claim 9, wherein at least one of the base units includes a second recess in flow communication with the coolant passage, the second recess being adapted to receive a cooler.

12. The device of claim 9, wherein each of the base unit recesses includes a peripheral edge having a seal.

13. The device of claim 10, including a plug adapted to block a selected one of the flow paths.

14. The device of claim 10, wherein the inlet and outlet manifold transfer ports are asymmetrically arranged about a centerline of the inlet and outlet manifolds, thereby permitting portions of the inlet and outlet manifolds to block a selected one of the flow paths.

15. The device of claim 10, including a plurality of plugs adapted to block selected portions of the flow paths, whereby the coolant medium flows through the recesses in parallel.

16. The device of claim 10, including a plurality of plugs adapted to block selected portions of the flow paths, whereby the coolant medium flows through the recesses in series.

17. The device of claim 9, wherein each of the end manifolds includes a plurality of transfer ports, and wherein the base includes a plurality of inlet and outlet ports, at least one base inlet port being aligned with at least one transfer port of its adjacent end manifold, and at least one base outlet port being aligned with at least one transfer port of its adjacent end manifold, thereby defining a flow path across the base.

18. The device of claim 17, wherein each of the end manifolds includes a plurality of passages and further wherein the base includes a plurality of passages, thereby defining a plurality of flow paths across the base.

* * * * *